United States Patent
Korony

(10) Patent No.: US 8,208,266 B2
(45) Date of Patent: Jun. 26, 2012

(54) SHAPED INTEGRATED PASSIVES

(75) Inventor: Gheorghe Korony, Myrtle Beach, SC (US)

(73) Assignee: AVX Corporation, Fountain Inn, SC (US)

( * ) Notice: Subject to any disclaimer, the term of this patent is extended or adjusted under 35 U.S.C. 154(b) by 1051 days.

(21) Appl. No.: 12/119,800

(22) Filed: May 13, 2008

(65) Prior Publication Data

US 2008/0298031 A1    Dec. 4, 2008

Related U.S. Application Data

(60) Provisional application No. 60/932,153, filed on May 29, 2007.

(51) Int. Cl.
*H05K 1/16* (2006.01)
*H05K 3/00* (2006.01)

(52) U.S. Cl. ........ 361/761; 361/760; 361/765; 257/685; 257/686; 257/726; 338/313

(58) Field of Classification Search .......... 361/715, 361/717–721, 748, 749, 760–767, 744, 790–794, 361/771–774, 780–783; 174/254–264, 524, 174/535; 333/193–196, 133; 310/313 R, 310/348; 338/309, 313, 307; 257/713–727, 257/686, 738, 778–780, 79, 98, 99, 100, 257/690, 691, 735, 736, 783–784

See application file for complete search history.

(56) References Cited

U.S. PATENT DOCUMENTS 4,431,977 A    2/1984 Sokola et al.
4,472,762 A  * 9/1984 Spinelli et al. ............... 361/718
4,670,770 A    6/1987 Tai
5,111,179 A  * 5/1992 Flassayer et al. ............. 338/313

(Continued)

FOREIGN PATENT DOCUMENTS

JP    409320802 A  * 12/1997

(Continued)

OTHER PUBLICATIONS

A. A. Chambers, Surface Technology Systems, "Silicon Micro-Machining as An Enabling Technology for Advanced Device Packaging," *Semiconductor Manufacturing Magazine*, Nov. 2004.

*Primary Examiner* — Michail V Datskovskiy
(74) *Attorney, Agent, or Firm* — Dority & Manning, P.A.

(57) ABSTRACT

Shaped integrated passive devices and corresponding methodologies relate to construction and mounting of shaped passive devices on substrates so as to provide both mechanical and electrical connection. Certain components and component assemblies are associated with the implementation of surface mountable devices. Specially shaped integrated passive device are capable of providing simplified mounting on and simultaneous connection to selected electrical pathways on a printed circuit board or other mounting substrate. Shaped, plated side filter devices have plated sides which provide both mounting and grounding/power coupling functions. Thin film filters may be constructed on silicon wafers, which are then diced from the top surface with an angular dicing saw to produce a shaped groove in the top surface. The groove may be v-shaped or other shape, and is then plated with a conductive material. Individual pieces are separated by grinding the back surface of the wafer down to where the grooves are intercepted. The plated grooves serve as ground or power connection points for the filter circuit. The metallized slopes of the plated grooves are used in securing the individual pieces to a mounting surface, by soldering or using conductive epoxy.

16 Claims, 4 Drawing Sheets

U.S. PATENT DOCUMENTS

| | | | |
|---|---|---|---|
| 5,821,762 A * | 10/1998 | Hamaguchi et al. | 324/750.03 |
| 5,877,551 A | 3/1999 | Tostado et al. | |
| 5,917,403 A * | 6/1999 | Hashimoto et al. | 338/307 |
| 5,959,846 A * | 9/1999 | Noguchi et al. | 361/782 |
| 5,994,996 A * | 11/1999 | Van Den Broek et al. | 338/308 |
| 6,083,766 A * | 7/2000 | Chen | 438/15 |
| 6,111,306 A * | 8/2000 | Kawahara et al. | 257/666 |
| 6,121,637 A * | 9/2000 | Isokawa et al. | 257/99 |
| 6,202,299 B1 | 3/2001 | DiStefano et al. | |
| 6,271,598 B1 | 8/2001 | Vindasius et al. | |
| 6,297,551 B1 * | 10/2001 | Dudderar et al. | 257/723 |
| 6,304,167 B1 * | 10/2001 | Nakayama | 338/195 |
| 6,359,546 B1 * | 3/2002 | Oh | 338/313 |
| 6,441,475 B2 * | 8/2002 | Zandman et al. | 257/685 |
| 6,465,883 B2 * | 10/2002 | Olofsson | 257/728 |
| 6,492,896 B2 * | 12/2002 | Yoneda | 338/309 |
| 6,594,135 B1 | 7/2003 | Ervasti | |
| 6,714,420 B2 * | 3/2004 | Yoshisato et al. | 361/760 |
| 6,914,267 B2 * | 7/2005 | Fukasawa et al. | 257/98 |
| 6,954,130 B2 | 10/2005 | Marcoux et al. | |
| 7,112,879 B2 | 9/2006 | Fjelstad et al. | |
| 7,161,459 B2 * | 1/2007 | Harada et al. | 338/22 R |
| 7,285,847 B2 * | 10/2007 | Lee | 257/686 |

FOREIGN PATENT DOCUMENTS

JP 02000036621 A * 2/2000

* cited by examiner

SHAPED INTEGRATED PASSIVES

PRIORITY CLAIM

This application claims the benefit of previously filed U.S. Provisional Application entitled "SHAPED INTEGRATED PASSIVES," assigned U.S. Ser. No. 60/932,153, filed May 29, 2007, and which is incorporated herein by reference for all purposes.

FIELD OF THE INVENTION

The presently disclosed technology relates to shaped integrated passive devices and corresponding methodologies. More particularly, the present technology relates to construction and mounting of shaped passive devices on substrates so as to provide both mechanical and electrical connection.

BACKGROUND OF THE INVENTION

High density mounting of electronic components on printed circuit boards and other substrates is common in the electronics industry. Miniature ceramic surface mount type capacitors having multiple layers have been used for some time in electronic devices such as cellular telephones, network routers, computers, and the like. The manufacturing techniques of such devices must be precise to provide for the greatly reduced size of these devices, while still affording desirable electrical operating characteristics.

More recently it has become desirable to provide further types of components and various sub-circuits in on-board mountable form. Several United States patents are directed to various aspects of electronic component manufacture and mounting techniques. For example, U.S. Pat. No. 6,271,598 (Vindasius et al., entitled "Conductive Epoxy Flip-Clip on Chip") is directed to a chip-on-chip mounting arrangement wherein each of a plurality of stacked chips is provided with a beveled, insulated perimeter where a number of chips may be interconnected via conductive epoxy. U.S. Pat. No. 6,594,135 (Ervasti, entitled "Filter") is directed to a multi-stage filter produced on a connection base that includes a ground potential area on the back side thereof.

Additional publication material includes an article entitled "Silicon Micro-Machining as an Enabling Technology for Advanced Device Packaging" as published in Semiconductor Manufacturing Magazine, November 2004. Also, additional patent citations include U.S. Pat. No. 7,112,879 (Fielstad et al., entitled "Microelectronic Assemblies Having Complaint Layers"); U.S. Pat. No. 6,954,130 (Marcoux, et al., entitled "Integrated Passive Components and Package With Posts"); U.S. Pat. No. 6,202,299 (DiStefano et al., entitled "Semiconductor Chip Connection Components With Adhesives and Method of Making Same"); U.S. Pat. No. 5,877,551 (Tostado et al., entitled "Semiconductor Package Having a Ground or Power Ring and a Metal Substrate"); U.S. Pat. No. 4,670,770 (Tai, entitled "Integrated Circuit Chip and Substrate Assembly"); U.S. Pat. No. 4,431,977 (Sokola et al., entitled "Ceramic Bandpass Filter").

For some time, the design of various electronic components has been driven by a general industry trend toward miniaturization and ease of incorporation of components into new or existing applications. In such regard, a need exists for smaller electronic components having exceptional operating characteristics. For example, some applications require the use of passive devices exhibiting various characteristics including capacitive, inductive, and/or resistive characteristics or combination assemblies thereof, but are severely limited in the amount of space (known as "real estate") such devices may occupy on a circuit board. It is important that such devices or combinations be configured for maximum ease of physical and electrical attachment to such circuit boards while occupying the least amount of "real estate" possible.

While various implementations of surface mount passive devices and assemblies have been developed, no design has emerged that generally encompasses all of the desired characteristics as hereafter presented in accordance with the subject technology.

SUMMARY OF THE INVENTION

The present subject matter recognizes and addresses several of the foregoing issues, and others concerning certain aspects of integrated passive devices. Thus, broadly speaking, an object of certain embodiments of the presently disclosed technology is to provide an improved design for certain components and component assemblies associated with the implementation of surface mountable devices.

Aspects of certain exemplary embodiments of the present subject matter relate to the provision of a specially shaped integrated passive device capable of providing simplified mounting on and simultaneous connection to selected electrical pathways on a printed circuit board or other mounting substrate. In other present aspects, present subject matter may more generally be directed to shaped, plated side filter devices wherein the plated sides provide both mounting and grounding/power coupling functions.

Aspects of other exemplary embodiments of the present subject matter provide improved electrical coupling of certain signal pathways from a surface mount device to circuits or traces on a printed circuit board on which the device may be mounted.

Still further aspects of yet still other embodiments of the present subject matter provide enhancements to manufacturing methodologies associated with the use of surface mount type devices.

Still further, it is to be understood that the present technology equally applies to the resulting devices and structures disclosed and/or discussed herewith, as well as the corresponding involved methodologies.

In other present exemplary aspects, the present subject matter may more particularly relate to thin film filters constructed on silicon wafers. With such exemplary devices constructed as herein, following such filter construction, the silicon wafer may be preferably diced from the top surface with an angular dicing saw to produce a v-groove in the top surface. The v-groove may then preferably be plated with a conductive material and the individual pieces separated by grinding the back surface of the wafer down to where the grooves are intercepted. The plated grooves may then advantageously serve as ground or power connection points for the filter circuit as well as provide mounting functionality as the individual pieces may be secured to a mounting surface, securing (by soldering or using conductive epoxy) the pieces to a support substrate by using the metallized slopes of the plated grooves.

Further still, it should be strictly understood that while the present description relates primarily to the production of surface mountable shaped passive devices embodied as thin-film filters and their particular configurations allowing improved surface mounting methodologies, the description of such passive components does not constitute a limitation of the present technology. For example, the present technology may be applied to individual resistor, capacitor, or inductor elements or circuits involving plural such elements configured in various combinations. As such, the present subject matter anticipates combinations including, but not limited to, resistive and/or capacitive "ladder" configurations, resistive and/or capacitive matrix configurations and various other combinations of passive elements.

Yet further still it should be appreciated that certain aspects of the present subject matter may be applied to individual active components or combinations thereof with passive components. For example, active combinations including, but not limited to, amplifiers, oscillators, and other functional block assemblies may benefit from the present technology.

One exemplary present embodiment relates to an integrated electronic component, comprising a printed circuit board with at least one conductive trace thereon; an electronic device characterized by opposing top and bottom surfaces, first and second side surfaces and first and second end surfaces, such electronic device comprising a circuit and at least one respective first and second connection points for such circuit formed on such top surface of such electronic device; a first portion of plating material extending from such bottom surface of the electronic device, along such first side surface of the electronic device, and onto such top surface of such electronic device, wherein such first portion of plating material forms an electrical connection to the at least one first connection point on such top surface of such electronic device; a second portion of plating material extending from such bottom surface of such electronic device, along such second side surface of the electronic device, and onto such top surface of such electronic device, wherein such second portion of plating material forms an electrical connection to the at least one second connection point on such top surface of such electronic device; and at least one portion of conductive epoxy positioned between such printed circuit board and such electronic device for mounting such electronic device to such printed circuit board and for electrically connecting such first and second portions of plating material to the at least one conductive trace located on such printed circuit board.

In various alternatives of the foregoing exemplary embodiment, such circuit may comprise an integrated thin-film filter including at least one inductor and at least one capacitor, or may comprise at least one of a capacitor, inductor, resistor, filter, amplifier, and oscillator.

In other present exemplary alternative arrangements of the foregoing, each of such first and second side surfaces of such electronic device may slope outwardly from such top surface of such electronic device to such bottom surface of such electronic device.

In yet other present alternatives, such first portion of plating material may substantially cover such first side surface of such electronic device; and such second portion of plating material may substantially cover such second side surface of such electronic device.

In other present exemplary alternatives of the foregoing, selected ones of the at least one conductive trace on such printed circuit board may provide a ground connection to selected ones of such at least one first and second connection points for the circuit, and/or selected ones of such at least one conductive trace on such printed circuit board provide a power connection to selected ones of such at least one first and second connection points for such circuit.

In the foregoing exemplary integrated electronic component, in some alternatives thereof such circuit may further comprise respective input and output terminals; and such printed circuit board may include respective terminal pads to which such respective input and output terminals of such circuit are electrically connected. In such alternatives, further optional features may be practiced, for example, including a first wire bond connection for electrically coupling such input terminal of such circuit to one of such terminal pads on such printed circuit board; and a second wire bond connection for electrically coupling such output terminal of such circuit to one of such terminal pads on such printed circuit board.

In yet another present exemplary embodiment of the present subject matter, a surface mount electronic component may comprise a substrate characterized by opposing top and bottom surfaces, first and second side surfaces, and first and second end surfaces; a circuit, formed on such top surface of such substrate, and including at least one pair of first and second opposing connection points; a first portion of plating material, formed along such top surface of such substrate onto such at least one first connection point, and also extending from such top surface of such substrate along such first side surface of such substrate to such bottom surface of such substrate; and a second portion of plating material, formed along such top surface of such substrate onto such at least one second connection point, and also extending from such top surface of such substrate along such second side surface of such substrate to such bottom surface of such substrate. In the foregoing exemplary embodiment, preferably such first and second portions of plating material are respectively configured to provide both mechanical and electrical connections for such electronic component when such electronic component is mounted in a circuit environment.

It should be understood that the present subject matter is equally applicable to corresponding methodologies. For example, one present exemplary methodology relates to a method of making electronic components, comprising providing a substrate characterized by respective top and bottom surfaces; forming a plurality of respective circuits on the top surface of the substrate, wherein each circuit comprises at least one connection point; forming at least one groove in the upper surface of the substrate between selected ones of the plurality of respective circuits, wherein the at least one groove is formed only partially through the substrate in a direction towards the bottom surface of the substrate; metallizing respective areas along the top surface of the substrate, wherein each metallized area extends across a given groove, onto one or more portions of the top surface of the substrate adjacent to the given groove and further into contact with at least one connection point associated with a respective circuit; and separating the plurality of respective circuits.

In alternatives of the foregoing exemplary method, such step of separating the plurality of respective circuits may comprise forming one or more cuts completely through the substrate.

In other present alternatives, such method may further comprise a step of grinding the bottom surface of the substrate. In such alternative, such step of separating the plurality of respective circuits may comprise such grinding step; and such grinding step may continue until the bottom portions of the at least one groove are reached.

In other present alternatives of the foregoing, such grinding step may comprise situating the top surface of the substrate face down onto an adhesive coated material; and grinding the exposed bottom surface of the substrate.

In yet other present alternative methodologies, such step of forming at least one groove may comprise cutting a groove with a dicing saw. Still further, such step of forming at least one groove may alternatively comprise cutting one of a V-shaped groove, a rectangular groove, a multi-stepped groove, and a semi-circular groove.

In other present exemplary alternative methodologies, such step of metallizing respective areas may comprise plating a conductive metal; or one or more of such respective circuits may comprise a thin-film filter including at least one inductor and at least one capacitor; or selected circuits formed on the substrate may comprise one or more of a capacitor, inductor, resistor, filter, amplifier, and oscillator. In still further present alternatives, the plurality of respective circuits may be formed on the top surface of the substrate in an array of rows of circuits; and a groove may be formed on the top surface of the substrate between each row of circuits.

Additional objects and advantages of the present subject matter are set forth in, or will be apparent to those of ordinary skill in the art from, the detailed description herein. Also, it should be further appreciated by those of ordinary skill in the art that modifications and variations to the specifically illustrated, referenced, and discussed features and/or steps hereof may be practiced in various embodiments and uses of the disclosed technology without departing from the spirit and scope thereof, by virtue of present reference thereto. Such variations may include, but are not limited to, substitution of equivalent means, steps, features, or materials for those shown, referenced, or discussed, and the functional, operational, or positional reversal of various parts, features, steps, or the like.

Still further, it is to be understood that different embodiments, as well as different presently preferred embodiments, of this technology may include various combinations or configurations of presently disclosed steps, features or elements, or their equivalents (including combinations of features, configurations, or steps thereof not expressly shown in the figures or stated in the detailed description).

BRIEF DESCRIPTION OF THE DRAWINGS

A full and enabling description of the present subject matter, including the best mode thereof, directed to one of ordinary skill in the art, is set forth in the specification, which makes reference to the appended figures, in which.

Figure 1:
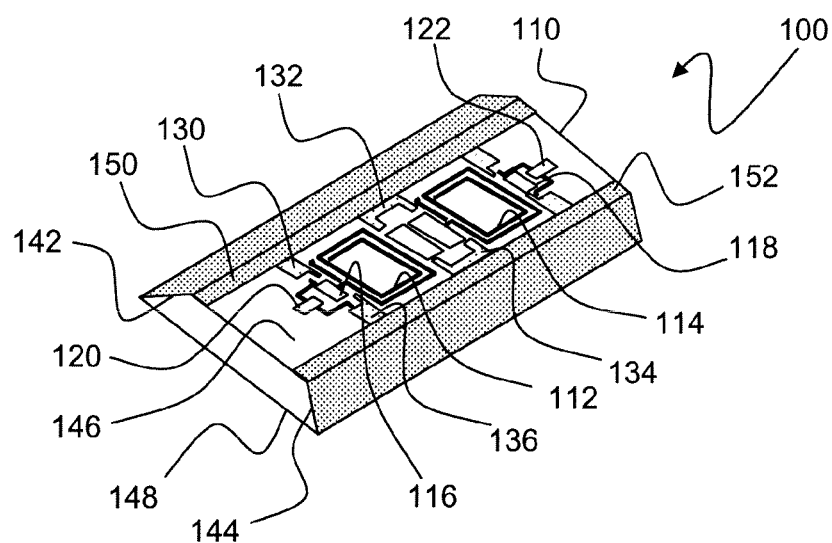
FIG. 1 illustrates a generally top, side, and end perspective view of an exemplary passive thin-film filter device constructed in accordance with the present technology.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with certain aspects of integrated passive devices and related technology and manufacturing methodology. More particularly, the present subject matter is concerned with improved shaped integrated passive devices designed to provide improvements in mounting and electrical connection technologies for both passive and active devices and combinations thereof, and related construction methodologies.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. In additional, certain features may be interchanged with similar devices or features not expressly mentioned which perform the same or similar function.

Reference will now be made in detail to exemplary presently preferred embodiments involving an exemplary shaped integrated passive thin-film filter device generally 100. Referring now to the drawings, FIG. 1 illustrates a generally right-side, top, end perspective view of an exemplary passive thin-film filter device generally 100 constructed in accordance with the present technology.

Figure 2:
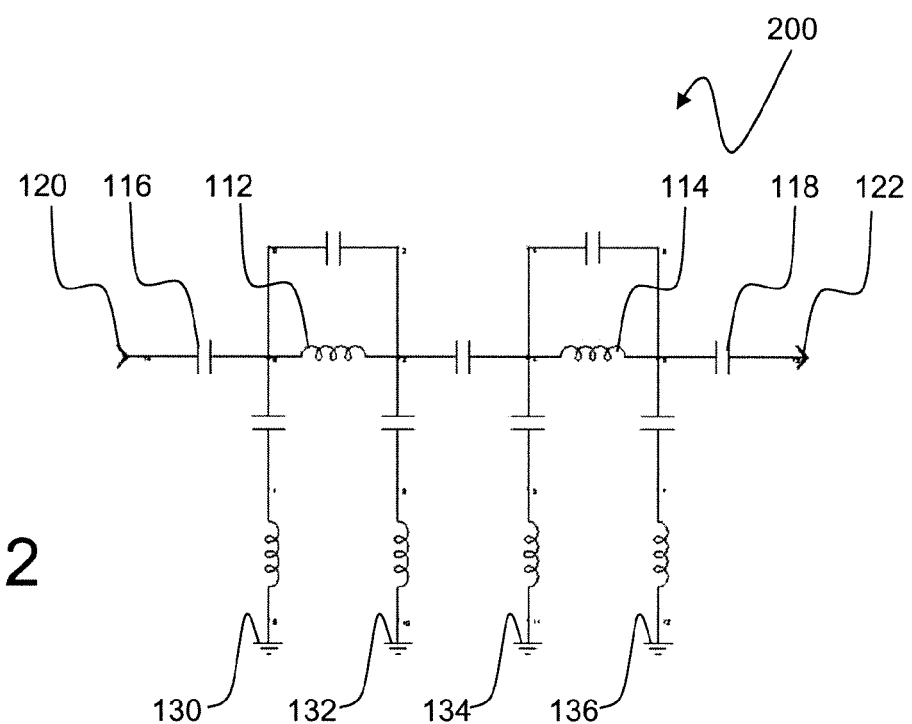
FIG. 2 is an electrical circuit schematic representation of the exemplary filter structure illustrated in FIG. 1.

Exemplary passive thin-film filter device 100 may correspond to a multi-pole filter circuit 200, as schematically illustrated in FIG. 2. Multi-pole filter circuit 200 may be constructed on silicon wafer generally 110 or other suitable substrate material including, but not limited to, high-resistivity silicon, glass, quartz, or any other insulating material using techniques for constructing such devices on silicon that are well known to those of ordinary skill in the art. As such construction techniques are well known and form no particular part of the present subject matter; such will not be further described herein.

As may be observed from a comparison of present FIGS. 1 and 2, exemplary passive thin-film filter device 100 may include a number of components, only selected individual exemplary ones of which are herein specifically identified, including for example inductors 112 and 114 and capacitors 116 and 118. It should be appreciated that the exact form of filter provided in association with exemplary shaped passive thin-film filter device 100 is not a limitation of the present technology but rather an example of the type of device and an exact form thereof that may be provided through use of the present technology.

With further reference to FIGS. 1 and 2, it will be noticed that an exemplary input terminal 120 and exemplary output terminal 122 are provided for multi-pole filter circuit 200. Further, a number of ground connection or reference points 130, 132, 134, and 136 are provided. The presence of ground connection or reference points 130, 132, 134, and 136 in association with the components forming multi-pole filter circuit 200, are significant to the present subject matter in that the specific physical configuration of shaped passive thin-film filter device 100 constructed in accordance with the present technology provides advantageous and previously unknown combined mounting and electrical connection capabilities.

More particularly, as may be seen from FIG. 1, respective pairs of ground connection or reference points 130, 132, and 134, 136 may be electrically coupled directly together by way of plating material formed over respective portions 150 and 152, formed respectively of upper surface 146 and respective sloped sides 142, 144 of shaped passive thin-film filter device 100. Such electrical coupling of ground connection or reference points 130, 132, 134, and 136 provides a significant advance over previous connection methodologies involving similar types of devices.

Prior to the development of the present technology, multiple wire bond connections would have been required to connect the multiple points 130, 132, 134, and 136. Such multiple connection wire bonding technology not only requires significant costs in both labor and time for production, but results in multiple points where manufacturing problems may occur as well as multiple opportunities for impacting electrical characteristics of the mounted device by way of possible variations in bonding contact resistance as well as variations in lead length of the wire bonds themselves resulting in variations in inductance to ground or other connections.

Devices constructed in accordance the present technology avoid all such potential problems by providing much improved capabilities and characteristics. More specifically, it will be noticed that side portions 142, 144 of an exemplary embodiment of shaped passive thin-film filter device 100 are sloped outwardly from a top surface 146 toward a bottom surface 148. It should be appreciated, however, that alternative shapes for side portions 142, 144 are possible as will be further addressed hereinbelow with reference to FIG. 5b. An exemplary methodology for achieving such sloped configuration will be discussed more fully hereinbelow with respect to FIGS. 4-7.

The provision of sloped side portions 142, 144 represents an advantageous aspect of certain embodiments of the present subject matter. More particularly, sloped side portions 142, 144 may be conductively plated so as to provide not only electrical connection points for selected components of filter 200 but so as to also provide a simplified mounting capability for the finished shaped passive thin-film filter device 100. Conductive plating material may correspond to gold plating or other appropriate conductive materials, the selection of which materials is known to those of ordinary skill in the art without additional discussion.

Figure 3:
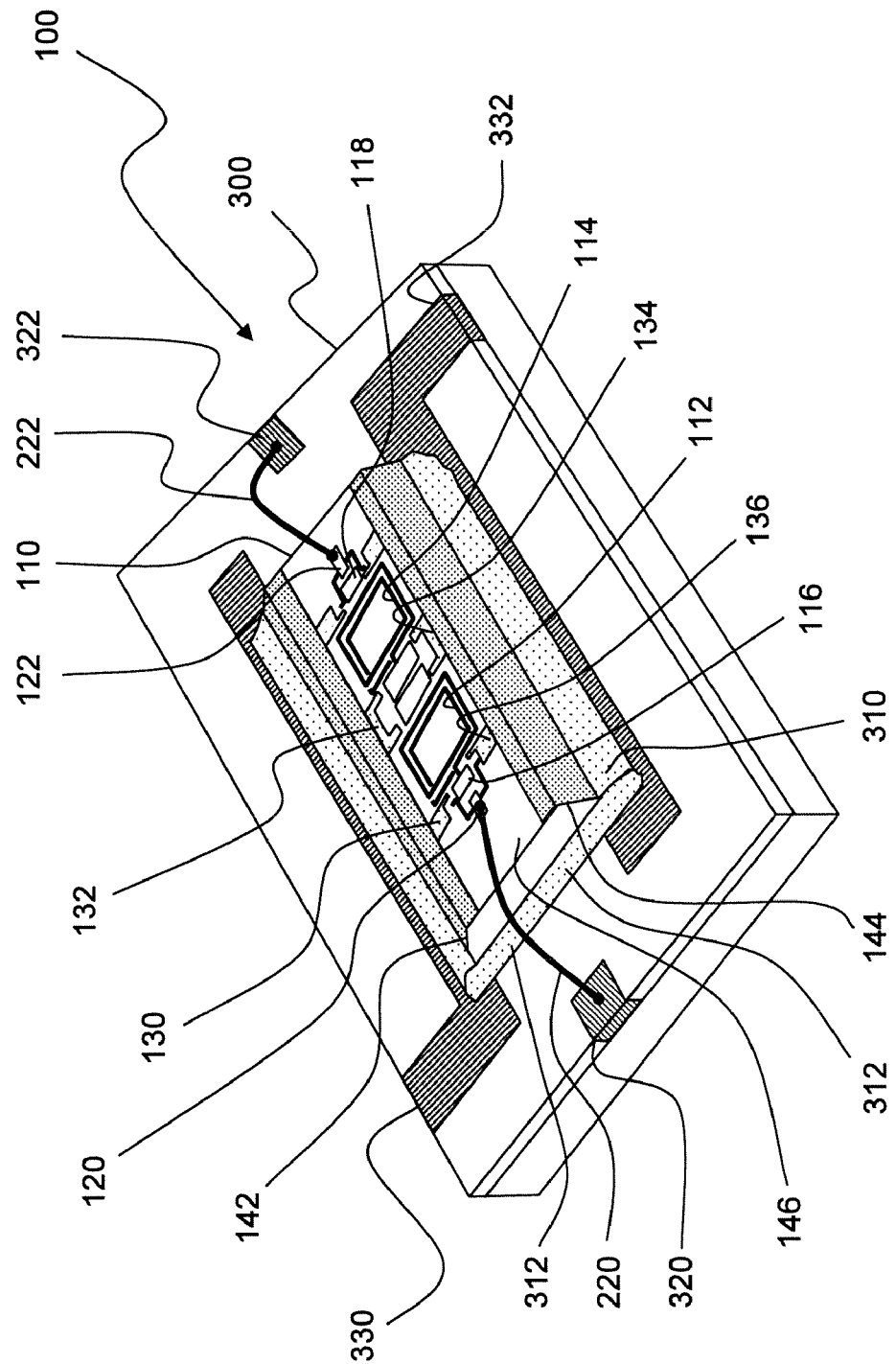
FIG. 3 is a generally top, side, and end perspective view of a shaped passive thin-film filter device constructed and mounted on a substrate, in accordance with the present technology.
Figure 4:
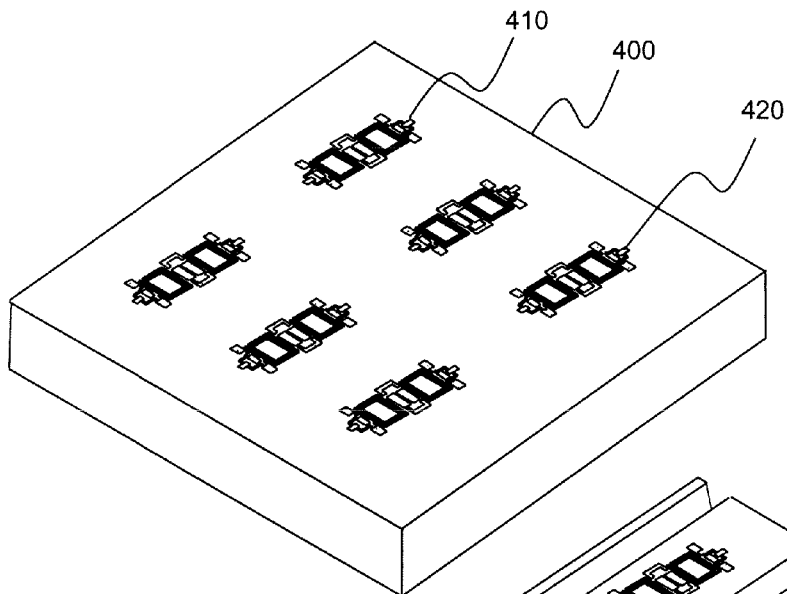
FIGS. 4, 5a, 6, and 7 are various generally top, side, and end perspective views respectively representing various stages of construction for the shaped passive thin-film filter device constructed in accordance with the present technology.

As may be further seen in present FIG. 3, the exemplary finished shaped passive thin-film filter device 100 of the present subject matter may be mounted to an exemplary printed circuit board 300 or other suitable substrate by way of representative conductive epoxy 310. Conductive epoxy 310 may extend beneath passive thin-film filter device 100 as illustrated in FIG. 3 at reference area 312 so that both mechanical and electrical connections may be implemented with selected portions of printed circuit board 300. As illustrated in FIG. 3, passive thin-film filter device 100, and particularly also the conductive plating formed on sloped sides 142, 144, may be respectively mechanically and electrically coupled to, for example, respective conductive traces 330, 332 on printed circuit board 300.

In an exemplary configuration where conductive epoxy 310 extends beneath device 100, conductive traces 330, 332 may be electrically coupled together by portion 312 of conductive epoxy 310. Alternatively, conductive epoxy 310 may be placed only at the edges of plated sloped sides 142, 144 so that an electrical connection may not be completed between conductive traces 330, 332. If, as in the presently described exemplary embodiment, conductive traces 330, 332 are designed to provide a ground or reference connection for the thin-film filter device 100 as illustrated, the electrical connection of traces 330, 332 may be appropriate. In fact, traces 330, 332 may actually be connected on the substrate or might correspond to a singe trace.

In alternative embodiments, also in accordance with the present subject matter, where device 100 may correspond to alternative type devices including matrix or ladder type configurations of resistor and/or capacitor combinations (or alternatively yet, active device configurations as previously mentioned hereinabove), traces 330, 332 may correspond to power rails providing operating power to device 100 and, therefore should not be connected together. In such instances, as will be understood by those of ordinary skill in the art, conductive epoxy 310 may be applied only in the areas adjacent the junctures of sloped sides 142, 144 and bottom surface 148.

With further reference to FIG. 3, it will be seen that input terminal 120 of thin-film filter device 100 may be connected to terminal pad 320 on printed circuit board 300 such as by way of wire bond connection 220. Terminal pad 320 may, in turn, be coupled to other components or circuitry (for the sake of clarity, not presently illustrated) on printed circuit board 300. Likewise, output terminal 122 of thin-film filter device 100 may be connected to output terminal pad 322 such as by way of wire bond connection 222. In a manner similar to that associated with input terminal pad 320, output terminal pad 322 may also be connected to additional components or circuitry (not presently illustrated) on printed circuit board 300.

As may be seen with still further reference to FIG. 3, mechanical and electrical connection of thin-film filter device 100 may be accomplished simply and effectively in accordance with the present technology, for example, through the use of conductive epoxy 310 and two wire bonds. Previously, mounting of a similar filter or other devices would have required many additional wire bonds to provide an alternative to the connections supplied by the conductive epoxy and plated slope technology in accordance with the present subject matter.

As mentioned previously, an important aspect of the present subject matter relates to the improved electrical characteristics obtained through implementation of the present subject matter. More specifically, by elimination of the previously required plurality of wire bonds, variations and reduction in or elimination of connecting line inductance and resistance are provided by application of the present subject matter. In particular the elimination of undesirable inductance produced by previously employed wire bonds translates to significant improvement in the high-frequency behavior of the filter.

With reference now to FIGS. 4, 5a, 6, and 7, exemplary methodology for constructing exemplary thin-film filter device 100 in accordance with the present technology will be described. As may be seen in FIG. 4, several of thin-film filters representatively illustrated at 410, 420 may be constructed on silicon wafer 400 using techniques well known to those of ordinary skill in the art. It should be appreciated that there may, in fact, be many more than the six devices illustrated constructed simultaneously on wafer 400.

Figure 5A:
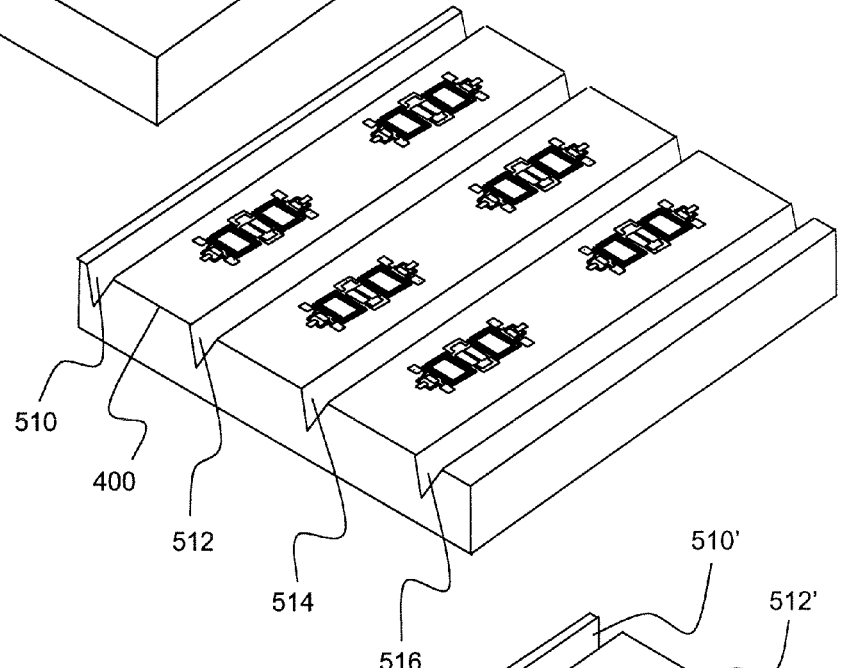
Figure 6:
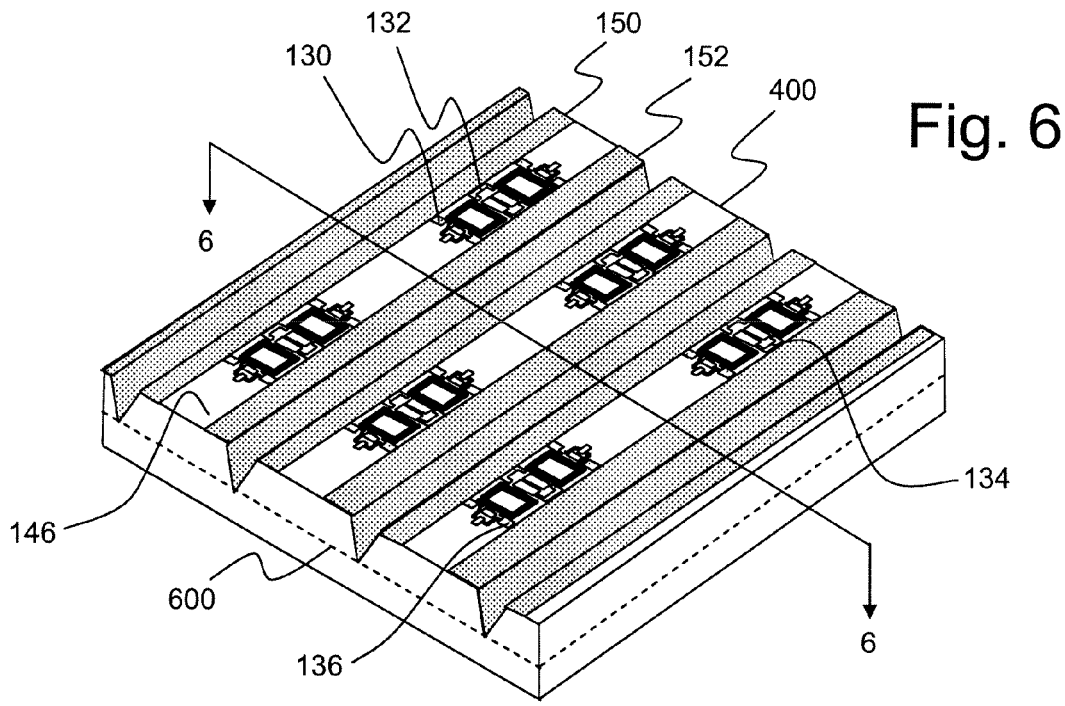

Following formation of the multiple thin-film filters 410, 420, in accordance with an exemplary embodiment of present subject matter, V-shaped grooves 510, 512, 514, and 516 (see FIG. 5a) may be cut or formed along the longer sides of thin-film filters 410, 420, for example, such as by using an angular dicing saw. As illustrated in FIG. 5a, V-shaped grooves 510, 512, 514, and 516 are formed only partially through silicon substrate 400. A metallization process as represented in FIG. 6 may then be employed to metallize the V-shaped grooves as well as portions 150, 152 of the upper surface 146 of silicon substrate 400. Metallization portions 150, 152 extend sufficiently over upper surface 146 of silicon substrate 400 so as to contact and electrically connect with ground connection or reference points 130, 132, 134, and 136, as previously discussed with reference to present FIGS. 1 and 2.

Figure 5B:
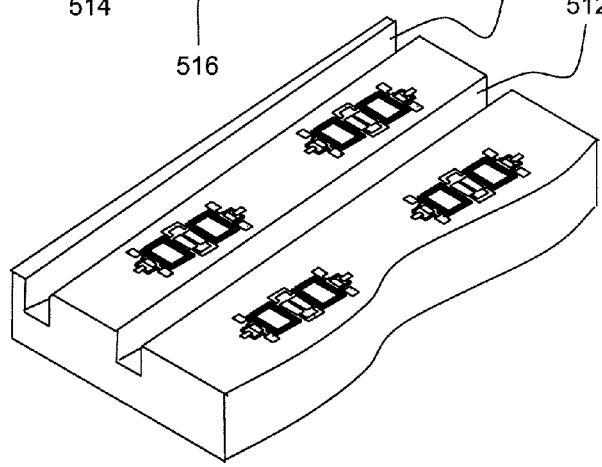
FIG. 5b illustrates a partial view of an alternative embodiment of the partially constructed shaped passive thin-film filter device of FIG. 5a showing an alternative rectangular groove arrangement.

With brief reference to FIG. 5b, it should be appreciated that other groove configurations may be employed without departing from the spirit and scope of the present subject matter. In that light, a portion of a second exemplary embodiment of the present subject matter is illustrated in FIG. 5b wherein rectangular grooves 510', 512' have been provided. It should be farther appreciated that the exact shape of the groove is not a limitation of the present subject matter as appropriate grooves may be provided in many forms. Non-limiting additional examples may include multi-stepped grooves, semi-circular grooves or other configuration. The grooves simply need to be configured so as to penetrate only partially through the substrate and be configured so as to permit plating or metallization as previously described.

Figure 7:
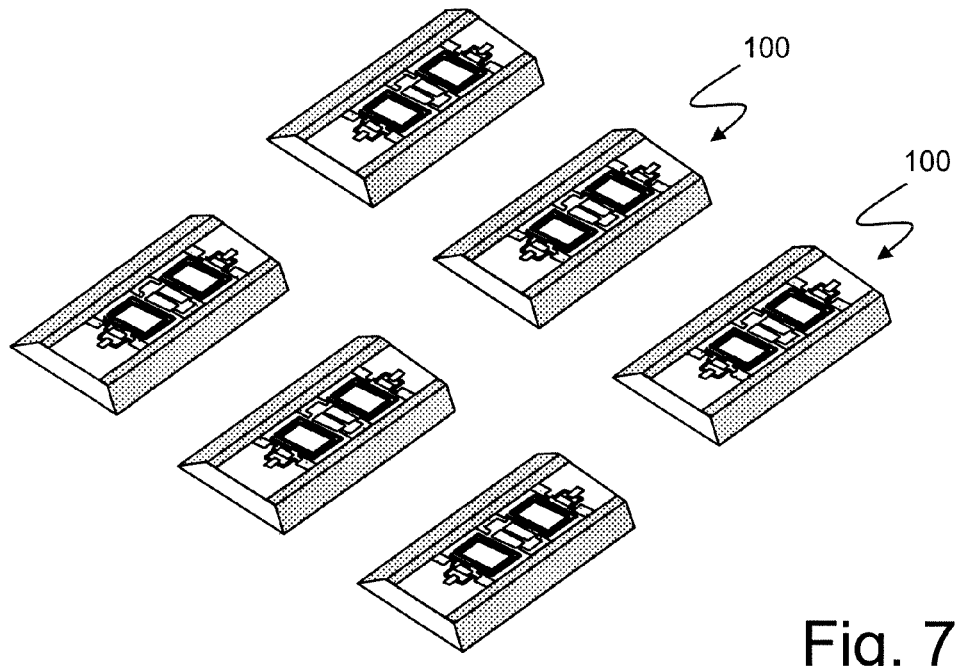

Final steps in the production of individual shaped passive thin-film filter devices 100 may require backgrinding of silicon substrate 400, and the introduction of one or more straight or other suitable cuts through substrate 400 as, for example, illustrated at cut line 6-6 of FIG. 6. Backgrinding, that is, the removal of a portion of the rear side of silicon substrate 400 by grinding, may be achieved such as by situating substrate 400 face down onto an adhesive coated material and thereafter grinding the exposed rear surface. Such grinding may continue until the bottom portions of V-shaped grooves 510, 512, 514, and 516 are reached, generally as illustrated at about line 600 (FIG. 6). Final cuts along line 6-6 of FIG. 6 may then be used to separate the individual shaped passive thin-film filter devices 100, completion of which is as illustrated in FIG. 7.

While the present subject matter has been described in detail with respect to specific embodiments thereof, it will be appreciated that those skilled in the art, upon attaining an understanding of the foregoing may readily adapt the present technology for alterations or additions to, variations of, and/or equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed is:

1. An integrated electronic component, comprising:
    a printed circuit board with at least one conductive trace thereon;
    an electronic device characterized by opposing top and bottom surfaces, first and second side surfaces and first and second end surfaces, said electronic device comprising a circuit and at least one respective first and second connection points for said circuit formed on said top surface of said electronic device;
    a first portion of plating material extending from said bottom surface of the electronic device, along said first side surface of the electronic device, and onto said top surface of said electronic device, wherein said first portion of plating material forms an electrical connection to the at least one first connection point on said top surface of said electronic device;
    a second portion of plating material extending from said bottom surface of said electronic device, along said second side surface of the electronic device, and onto said top surface of said electronic device, wherein said second portion of plating material forms an electrical connection to the at least one second connection point on said top surface of said electronic device; and
    at least one portion of conductive epoxy positioned between said printed circuit board and said electronic device for mounting said electronic device to said printed circuit board and for electrically connecting said first and second portions of plating material to the at least one conductive trace located on said printed circuit board.

2. The integrated electronic component of claim 1, wherein said circuit comprises an integrated thin-film filter including at least one inductor and at least one capacitor.

3. The integrated electronic component of claim 1, wherein said circuit comprises at least one of a capacitor, inductor, resistor, filter, amplifier, and oscillator.

4. The integrated electronic component of claim 1, wherein each of said first and second side surfaces of said electronic device slopes outwardly from said top surface of said electronic device to said bottom surface of said electronic device.

5. The integrated electronic component of claim 1, wherein:
    said first portion of plating material substantially covers said first side surface of said electronic device; and
    wherein said second portion of plating material substantially covers said second side surface of said electronic device.

6. The integrated electronic component of claim 1, wherein selected ones of the at least one conductive trace on said printed circuit board provide a ground connection to selected ones of said at least one first and second connection points for the circuit.

7. The integrated electronic component of claim 1, wherein selected ones of said at least one conductive trace on said printed circuit board provide a power connection to selected ones of said at least one first and second connection points for said circuit.

8. The integrated electronic component of claim 1, wherein:
    said circuit further comprises respective input and output terminals; and
    said printed circuit board includes respective terminal pads to which said respective input and output terminals of said circuit are electrically connected.

9. The integrated electronic component of claim 8, further comprising:
    a first wire bond connection for electrically coupling said input terminal of said circuit to one of said terminal pads on said printed circuit board; and
    a second wire bond connection for electrically coupling said output terminal of said circuit to one of said terminal pads on said printed circuit board.

10. A surface mount electronic component, comprising:
    a substrate characterized by opposing top and bottom surfaces, first and second side surfaces, and first and second end surfaces;
    a circuit, formed on said top surface of said substrate, and including at least one pair of first and second opposing connection points;
    a first portion of plating material, formed along said top surface of said substrate onto said at least one first connection point, and also extending from said top surface of said substrate along said first side surface of said substrate to said bottom surface of said substrate; and
    a second portion of plating material, formed along said top surface of said substrate onto said at least one second connection point, and also extending from said top surface of said substrate along said second side surface of said substrate to said bottom surface of said substrate;
    wherein said first and second portions of plating material are respectively configured to provide both mechanical and electrical connections for said electronic component when said electronic component is mounted in a circuit environment; and
    each of said first and second side surfaces of said substrate slopes outwardly from said top surface of said substrate to said bottom surface of said substrate.

11. The surface mount electronic component of claim 10, wherein said circuit comprises an integrated thin-film filter including at least one inductor and at least one capacitor.

12. The surface mount electronic component of claim 10, wherein said circuit comprises at least one of a capacitor, inductor, resistor, filter, amplifier, and oscillator.

13. The surface mount electronic component of claim 10, wherein:

said first portion of plating material substantially covers said first side surface of said substrate; and wherein said second portion of plating material substantially covers said second side surface of said substrate.

14. The surface mount electronic component of claim 10, wherein said first and second side surfaces of said substrate are longer than said first and second end surfaces of said substrate.

15. The surface mount electronic component of claim 10, wherein selected ones of said first and second opposing connection points are configured for providing an electrical ground connection to said circuit.

16. The surface mount electronic component of claim 10, wherein selected ones of said first and second opposing connection points are configured for providing an electrical power connection to said circuit.

\* \* \* \* \*